(12) United States Patent
Mas et al.

(10) Patent No.: US 11,895,417 B2
(45) Date of Patent: Feb. 6, 2024

(54) IMAGE SENSOR

(71) Applicants: STMicroelectronics France, Montrouge (FR); STMicroelectronics (Grenoble 2) SAS, Grenoble (FR); STMicroelectronics (Crolles 2) SAS, Crolles (FR)

(72) Inventors: Celine Mas, Poisat (FR); Matteo Maria Vignetti, Aix les Bains (FR); Francois Agut, Saint Vital (FR)

(73) Assignees: STMicroelectronics France, Montrouge (FR); STMicroelectronics (Grenoble 2) SAS, Grenoble (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/667,485

(22) Filed: Feb. 8, 2022

(65) Prior Publication Data
US 2022/0272291 A1 Aug. 25, 2022

(30) Foreign Application Priority Data
Feb. 19, 2021 (FR) ...................... 2101644

(51) Int. Cl.
*H04N 25/709* (2023.01)
*H04N 25/75* (2023.01)
*H01L 27/146* (2006.01)

(52) U.S. Cl.
CPC .......... *H04N 25/709* (2023.01); *H04N 25/75* (2023.01); *H01L 27/1463* (2013.01); *H01L 27/14609* (2013.01)

(58) Field of Classification Search
CPC .... H04N 25/709; H04N 25/75; H04N 25/705; H01L 27/14609; H01L 27/1463; H01L 27/14612; G01S 7/4863; G01S 7/4914
See application file for complete search history.

(56) References Cited

U.S. PATENT DOCUMENTS

| 2011/0037969 A1 | 2/2011 | Spickermann et al. |
| 2016/0249002 A1 | 8/2016 | Kim et al. |
| 2017/0227643 A1 | 8/2017 | Nagai |

FOREIGN PATENT DOCUMENTS

| EP | 3188238 A1 | 7/2017 | |
| WO | WO-2021204816 A1 * | 10/2021 | ............. G01S 17/06 |

* cited by examiner

*Primary Examiner* — Twyler L Haskins
*Assistant Examiner* — Angel L Garces-Rivera
(74) *Attorney, Agent, or Firm* — Slater Matsil, LLP

(57) ABSTRACT

The present description describes an image sensor including an array of pixels arranged inside and on top of a region of a semiconductor substrate electrically insulated from the rest of the substrate by insulating trenches crossing the substrate, each pixel including a photoconversion area and at least two assemblies, each including a memory area and a transfer gate coupling the memory area to the photoconversion area, and a circuit configured to apply, for each pixel and at least during each integration phase, a bias voltage different from ground to a portion of the substrate having the pixel arranged inside and on top of it.

21 Claims, 3 Drawing Sheets

IMAGE SENSOR

CROSS-REFERENCE TO RELATED APPLICATIONS

This application claims the benefit of French Patent Application No. 2101644, filed on Feb. 19, 2021, which application is hereby incorporated herein by reference.

TECHNICAL FIELD

The present disclosure generally concerns image sensors and, more particularly, an image sensor configured to obtain a depth map of a scene to be captured.

BACKGROUND

A time-of-flight image sensor enables determining a depth map of a scene to be captured.

Among time-of-flight image sensors, direct time-of-flight and indirect time-of-flight sensors can be distinguished.

In a sensor of indirect time of flight type, or indirect time-of-flight sensor, light is periodically emitted towards the scene to be captured, and light reflected by the scene is received by pixels of an array of pixels of the sensor. During an acquisition, during an integration phase where light is emitted by the sensor, in each pixel, charges are then photogenerated in a photoconversion area of the pixel, and are alternately transferred towards at least two memory areas of the pixel, at a frequency for example identical to that of the emitted light, but that may be phase-shifted with respect to the frequency of the emitted light. During this acquisition, during a readout phase, the information stored by each memory area of a pixel is read. A digital processing of the information read from the pixels during a plurality of acquisitions, each having a different phase shift between the frequency of the emitted light and that of the charge transfers then enables determining a depth map of the scene, that is, mapping the distances between each point of the scene and the sensor.

Known image sensors, in particular of indirect time-of-flight type, suffer from various disadvantages.

SUMMARY

There is a need to overcome all or part of the disadvantages of known image sensors, particularly of image sensors of indirect time of flight type.

An embodiment overcomes all or part of the disadvantages of known image sensors, particularly of image sensors of indirect time of flight type.

An embodiment provides an image sensor comprising an array of pixels arranged inside and on top of a region of a semiconductor substrate electrically insulated from the rest of the substrate by insulating trenches crossing the substrate, each pixel comprising a photoconversion area and at least two assemblies, each comprising a memory area and a transfer gate coupling the memory area to the photoconversion area; and a circuit configured to apply, for each pixel and at least during each integration phase, a bias voltage different from ground to a portion of the substrate having the pixel arranged inside and on top of it.

According to an embodiment, the bias voltage is determined so that, for each assembly of each pixel, the transfer gate of the assembly is blocked when the bias voltage is applied to the portion of the substrate having the pixel arranged inside and on top of it and the ground potential is applied to the transfer gate.

According to an embodiment, at least a portion of the rest of the substrate is configured to be biased to ground.

According to an embodiment, each pixel comprises at least one detection node connected to an electrode of a capacitive element, preferably of metal-insulator-metal type, the other electrode of the capacitive element being connected to ground.

According to an embodiment, the circuit is configured to control, for each transfer gate of each assembly of each pixel, a setting to the conductive state of the transfer gate by applying a control potential to the transfer gate, and a setting to the blocked state by applying the ground potential to the transfer gate.

According to an embodiment, the sensor comprises a switched-mode power supply configured to deliver the control potential.

According to an embodiment, the switched-mode power supply is implemented outside of the substrate.

According to an embodiment, the circuit is configured, for each pixel, to apply the bias voltage to the portion of the substrate having the pixel arranged inside and on top of it all along the duration of operation of the sensor.

According to an embodiment, the sensor comprises another circuit configured to receive a power supply voltage and to generate the bias voltage from the power supply voltage, this other circuit preferably comprising a low dropout, LDO, regulator, for example of class AB, configured to deliver the bias voltage.

According to an embodiment, the circuit is configured, for each pixel, to apply another bias voltage to the portion of the substrate having the pixel arranged inside and on top of it during each readout phase of the pixel.

According to an embodiment, the other bias voltage is determined so that, for each assembly of each pixel, each transfer gate of the assembly is blocked when the other bias voltage is applied to the portion of the substrate having the pixel arranged inside and on top of it and the ground potential is applied to the transfer gate.

According to an embodiment, the sensor comprises another circuit configured to receive a power supply voltage and to generate, from the power supply voltage, the bias voltage and the other bias voltage.

According to an embodiment, this other circuit comprises at least one low dropout, LDO, regulator, for example of class AB, configured to deliver the bias voltage and the other bias voltage.

According to an embodiment, each transfer gate of each assembly of each pixel has a buried channel.

According to an embodiment, the sensor is of indirect time-of-flight type.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the step of reading of the pixels of an indirect time-of-flight sensor, and the step of generation of an image of a scene to be captured after the pixel readout step have not been detailed, these steps being known or within the abilities of those skilled in the art, and the described embodiments and variants being compatible with these steps.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following description, unless specified otherwise, all potentials are referenced to ground GND.

Figure 1:
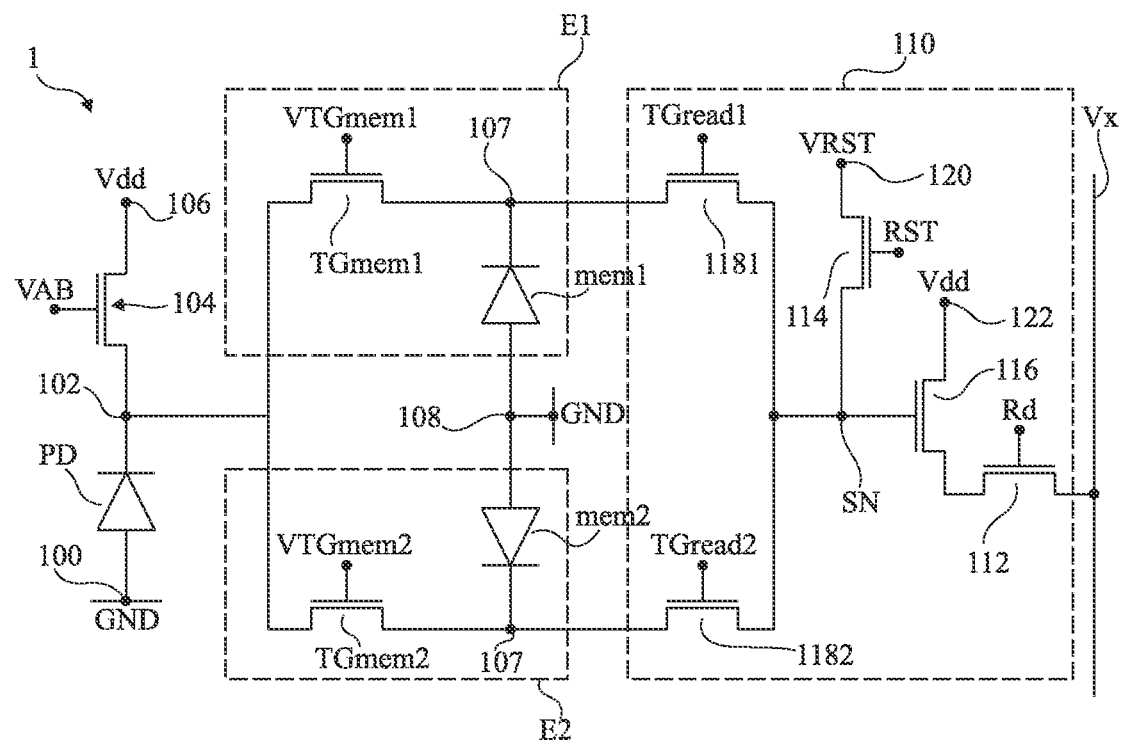
FIG. 1 schematically shows, in the form of a circuit, an example of a pixel.

FIG. 1 schematically shows, in the form of a circuit, an example of a pixel 1 of an image sensor. More particularly, FIG. 1 shows an example of a pixel of a sensor of indirect time of flight type.

Pixel 1 comprises a photoconversion area PD, for example, a photodiode, preferably a pinned photodiode. Area PD is configured so that charges, typically electron-hole pairs, are generated in area PD when the latter receives light. Photogenerated charges of a first type, for example, electrons, are accumulated in area PD, the photogenerated charges of the second type, for example, holes, being discharged from area PD.

In the shown example where the useful photogenerated charges, that is, those which have accumulated in area PD, are electrons, the anode of photodiode PD is coupled, preferably connected, to a node 100 of application of a reference potential, typically ground GND, the cathode of photodiode PD being connected to a node 102.

Pixel 1 comprises at least two identical assemblies, for example two assemblies E1 and E2 in the example of FIG. 1 where these assemblies E1 and E2 are delimited by dotted lines. Each assembly E1, E2 comprises a memory area, or storage area, mem1, mem2, and a transfer gate TGmem1, TGmem2 coupling the memory area of the assembly to area PD, that is, to node 102. For example, in assembly E1, respectively E2, transfer gate TGmem1, respectively TGmem2, is connected between node 102 and memory area mem1, respectively mem2.

In the example of FIG. 1, each memory area mem1, mem2 is implemented by a pinned diode or, in other words, corresponds to a pinned memory. In each assembly E1, E2, memory area mem1, mem2 is connected between a node 107 connected to transfer gate TGmem1, TGmem2 and a node 108 of application of a reference potential identical to the potential of node 100. In this example where memory areas mem1 and mem2 are pinned diodes and where the useful charges are electrons, the cathode of each memory area mem1, mem2 is connected to node 108, the anode of each memory area being connected to the node 107 of the considered assembly E1, E2.

Each transfer gate TGmem1, TGmem2 receives a control potential VTGmem1, VTGmem2. For example, gate TGmem1, respectively TGmem2, receives potential VTGmem1, respectively VTGmem2. During a phase of integration of the light reflected by a scene to be captured, each control signal VTGmem1, VTGmem2 is periodically switched between a first potential level, for example, high, for which the corresponding transfer gate is conductive and a second potential level, for example, low, for which the corresponding transfer gate is blocked and no charge is transferred from area PD to the corresponding memory area. When a transfer gate is conductive, the photogenerated charges accumulated in area PD are transferred to the memory area associated with this transfer gate. For example, when the control signal VTGmem1, respectively VTGmem2, applied to gate TGmem1, respectively TGmem2, is at the first level, the charges accumulated in area PD are attracted under the gate where they are temporarily stored, after which the switching of the control signal to the second level causes the transfer of these charges to memory area mem1, respectively mem2.

Control signals VTGmem1 and VTGmem2 are configured so that the charges accumulated in area PD are alternately transferred to each of the memory areas of pixel 1, as well known by those skilled in the art. In particular, it is known by those skilled in the art that control signals VTGmem1 and VTGmem2 are in phase opposition and are configured so that no charge transfer to one of memory areas mem1 or mem2 occurs at the same time as a charge transfer to the other one of these areas mem1 and mem2.

In this example, pixel 1 comprises an anti-blooming device 104. Device 104, for example, a MOS ("Metal Oxide Semiconductor") transistor, for example implemented by means of a capacitive deep trench insulation, or CDTI, receives a potential VAB. Device 104 is connected between node 102, in this example, the cathode of area PD, and a node 106 of application of a potential, for example, a power supply potential Vdd of pixel 1. The value of potential VAB during an integration phase is for example determined so that the charges photogenerated in area PD cannot be discharged, via device 104, to node 106 but are effectively transferred to memory areas mem1, mem2. The value of potential VAB during a readout phase is for example determined in order to empty area PD of all the photogenerated charges that might be located therein, without affecting the charges which have already been transferred to memory areas mem1 and mem2.

Pixel 1 further comprises an output circuit 110 (delimited by dotted lines in FIG. 1). Circuit 110 couples the assemblies E1, E2 of pixel 1 to one or a plurality of conductive lines Vx, for example shared by all the pixels of a same column of a pixel array. In the example of FIG. 1, circuit 110 is connected to a single line Vx. Circuit 110 is configured, when pixel 1 is selected during a readout phase, for example, when all the pixels of a same row of a pixel array are selected, to deliver signals representative of the state of the memory areas mem1, mem2 of the pixel, onto the line(s) Vx having circuit 110 connected thereto. These signals are for example representative of the number of charges transferred from area PD to each of areas mem1 and mem2 during an integration phase preceding the readout phase.

In the example of FIG. 1, circuit 110 comprises a selection transistor 112, a reset transistor 114, a transistor 116 assembled as a follower source, and two transfer devices 1181 and 1182, for example transfer gates.

Transfer gate 1181, respectively 1182, is connected between memory area mem1, respectively mem2, and a node SN of circuit 110, for example between the node 107 of assembly E1, respectively E2, and node SN. Node SN is for example a sense node.

Transfer gate 1181, respectively 1182, receives a control signal TGread1, respectively TGread2. As an example, a first potential level, for example, high, of signal TGread, respectively TGread2, makes transfer gate 1181, respectively 1182, conductive, so that the potential of node SN is then determined by the number of charges in memory area mem1, respectively mem2, and a second potential level, for example, low, of signal TGread1, respectively TGread2, blocks transfer gate 1181, respectively 1182, so that node SN is then electrically insulated from memory areas mem1, mem2.

Transistor 114 is connected between node SN and a node 120 of application of a reset potential VRST, for example, equal to potential Vdd. Transistor 114 receives a control signal RST. As an example, the first potential level of signal RST turns on transistor 114, for example, to reset node SN to potential VRST, and a second potential level of signal RST turns off transistor 114 so that node SN is then electrically insulated from node 120.

Transistor 116 has its gate connected to node SN, its source coupled, preferably connected, to transistor 112, and its drain coupled, preferably connected, to a node 122 of application of a potential, for example, potential Vdd.

Transistor 112 is connected between the source of transistor 116 and line Vx. Transistor 112 receives a control signal Rd. As an example, a first level or state of signal Rd turns on transistor 112, so that the potential on line Vx is then determined by that of node SN, and a second level of signal Rd turns off transistor 112, so that the potential on line Vx is independent from that of node SN.

In pixel 1, transfer gates TGmem1 and TGmem2 have a buried channel. Further, conventionally, the semiconductor substrate having pixel 1, and particularly transfer gates TGmem1 and TGmem2, implemented inside and on top of it, is biased to ground GND. As a result, the first level of signal VTGmem1, respectively VTGmem2, for setting gate TGmem1, respectively TGmem2, to the conductive state, and the second level of signal VTGmem1, respectively VTGmem2, for setting gate TGmem1, respectively TGmem2, to the off state having opposite signs or biasings. For example, when the useful photogenerated charges are electrons, the first level of signals VTGmem1 and VTGmem2 is positive, and the second level of signals VTGmem1 and VTGmem2 is negative.

The frequency at which each of the transfer gates TGmem1 and TGmem2 is alternately set to the off state (no charge transfer from area PD to the corresponding memory area mem1 or mem2) and to the conductive state (charge transfer from area PD to the corresponding memory area mem1 or mem2) is for example greater than 50 MHz, preferably in the order of one or several hundreds of MHz. Further, the higher this frequency, the higher the distance that may be determined between the sensor and a point of a scene to be captured. However, an increase in this frequency leads to an increase in the sensor power consumption, due to the fact that a large number of transfer gates TGmem1, respectively TGmem2, has to be controlled, with the same signal VTGmem1, respectively VTGmem2.

It should be noted that to obtain a depth map of a scene, it is possible to implement a plurality of acquisitions where the light is emitted at a first frequency and a phase shift between the frequency of the light and that of the charge transfers is different between successive acquisitions, and a plurality of other acquisitions where the light is emitted at a second frequency and a phase shift between the frequency of the light and that of the charge transfers is different between successive acquisitions.

Obtaining the depth map from successive acquisitions made at different frequencies enables increasing the span of the distance range over which the sensor operates with respect to the case where the light is always emitted at the same frequency. The implementation of a plurality of acquisitions with different emitted light frequencies applies to the case where, to obtain a depth map, the light is emitted at more than two different frequencies.

Figure 2:
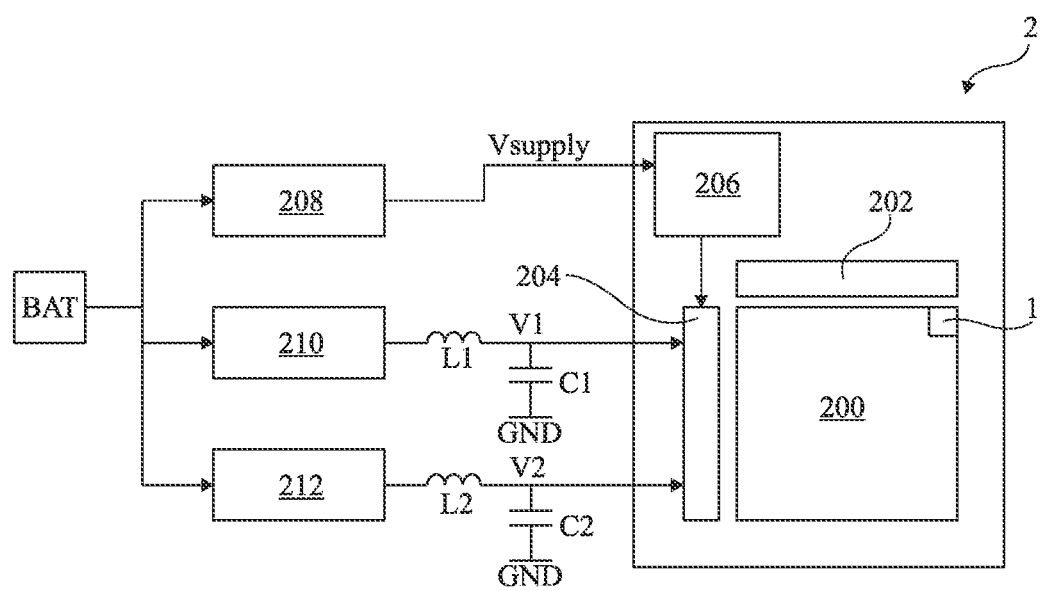
FIG. 2 schematically shows, in the form of blocks, an example of an image sensor of indirect time of flight type.

FIG. 2 schematically shows in the form of blocks an example of a sensor 2 of indirect time of flight type, sensor 2 comprising an array 200 of pixels 1. To avoid overloading the drawing, a single pixel 1 of array 200 is schematically shown in FIG. 2.

Array 200 is associated with at least one readout circuit 202. During a phase of reading of the pixels 1 of the array, for example, carried out by selecting the pixel rows one after the others, circuit 202 receives the output signals of the selected pixels, via conductive lines Vx (FIG. 1).

Array 200 is also associated with a control circuit 204. Circuit 204 is configured to deliver, to each pixel 1 of array 200, the pixel control signals. Circuit 204 is for example configured to deliver control signals VTGmem1, VTGmem2, TGread1, TGread2, RST, VAB and Rd to each pixel, these signals being for example identical for all the pixels 1 of a same row of array 200. As an example, although this is not detailed in FIG. 2, circuit 204 may comprise a first circuit delivering signals TGread1, TGread2, RST and Rd to each pixel, these signals being for example identical for all the pixels 1 of a same row of array 200, and a second circuit delivering signals VTGmem1, VTGmem2, and VAB. This second circuit is for example configured to deliver, for each pixel column, signals VTGmem1, VTGmem2, and VAB identical for all the pixels in the column, and is then preferably arranged along a side of array 200 parallel to the pixel rows. According to another example, this second circuit is configured to deliver, for each pixel row, signals VTGmem1, VTGmem2, and VAB identical for all the pixels in the row, and is then preferably arranged along a side of array 200 parallel to the pixel columns.

Sensor 2 for example comprises a circuit 206. Circuit 206 is configured to receive a power supply potential Vsupply, for example, in the order of 2.8 V, and to deliver, from this potential Vsupply, different potentials useful to the operation of the pixels 1 of array 200, for example, by delivering these potentials to circuit 204, which in turn delivers them to the pixels of array 200. Circuit 206 is for example configured to deliver, from potential Vsupply, the potentials VRST and Vdd and the two levels of potential VAB. The circuit is for example also configured to deliver the different potential levels of signals TGread1, TGread2, and Rd. Each potential delivered by circuit 206 is for example generated from potential Vsupply: by a low dropout (LDO) voltage regulator for positive potentials smaller than potential Vsupply, by a positive charge pump followed by a low dropout voltage regulator for positive potentials greater than potential Vsupply, and by a negative charge pump followed by a low dropout voltage regulator for negative potentials.

As an example, array 200, circuits 202, 204, and 206 of sensor 2 are implemented inside and on top of a same semiconductor substrate, preferably by using a small number of components to limit the spatial bulk of the system.

Sensor 2 further comprises an electric power supply source BAT, for example, a battery. As an example, as shown in FIG. 1, sensor 2 comprises a voltage regulator 208 configured to deliver current Vsupply from power supply source BAT.

Sensor 2 comprises a voltage converter 210, typically a switched-mode power supply or SMPS, and a voltage converter 212, typically a switched-mode power supply. Converter 210 is associated with an inductance L1 and with a capacitive element C1, converter 212 being associated with an inductance L2 and a capacitive element C2. Converter 210 is configured to deliver, from power source BAT, a first potential V1, converter 212 being configured to deliver, from power source BAT, a second potential V2. For each signal VTGmem1, respectively VTGmem2, potential V1 corresponds to the first level of signals VTGmem1 and VTGmem2, potential V2 corresponding to the second level of signals VTGmem1 and VTGmem2. Potentials V1 and V2 are delivered to the circuit 204 of sensor 2, so that circuit 204 can deliver control signals VTGmem1 and VTGmem2 to each pixel. The delivery of potentials V1 and V2 is implemented by switched-mode power supplies 210 and 212 given the strong power required to simultaneously charge and discharge the transfer gates of array 200, while keeping an acceptable efficiency and heating of the system.

As an example, each of converters 210 and 212 is implemented by an integrated circuit, and inductances L1 and L2 and capacitors C1 and C2 are discrete components. Preferably, each converter 210, 212 is implemented on a semiconductor substrate different from that comprising array 200. This enables avoiding for the operation of converters 210 and 212 to generate noise in the output signals of the pixels 1 of array 200 and, further, to limit the temperature rise in pixel array 200. Indeed, the quality of the image obtained with array 200 is dependent on its temperature and tends to decrease when its temperature increases.

During an integration phase implemented by sensor 2, many pixels, preferably all the pixels of array 200 in the case where the sensor is called global shutter sensor, are identically controlled. In other words, the switchings of signal VTGmem1, respectively VTGmem2, between levels V1 and V2 are implemented simultaneously in these pixels. This results in strong current surges on the outputs of converters 210 and 212. Due to these current surges, the implementation of converters 210 and 212 and of components L1, L2, C1, and C2 is complex and bulky.

Further, during a phase of reading of pixels 1, the transfer gates TGmem1 and TGmem2 of each pixel 1 should be maintained off while maintaining signals VTGmem1 and VTGmem2 at level V2. Due to the fact that level V2 is different from ground GND, this induces an electric power consumption which is not desirable. To limit this power consumption, it is possible to provide for converter 212 to operate in pulse frequency modulation or pulse skipping mode, or PFM, during the readout phase. This however further complicates the implementation of converter 212, in particular when the latter operates in pulse-width modulation during integration phases. Further, it is desirable, during a readout phase, for converter 212 to be low-noise to avoid adding disturbances to the pixel readout noise, which is not compatible with a PFM operation.

Figure 3:
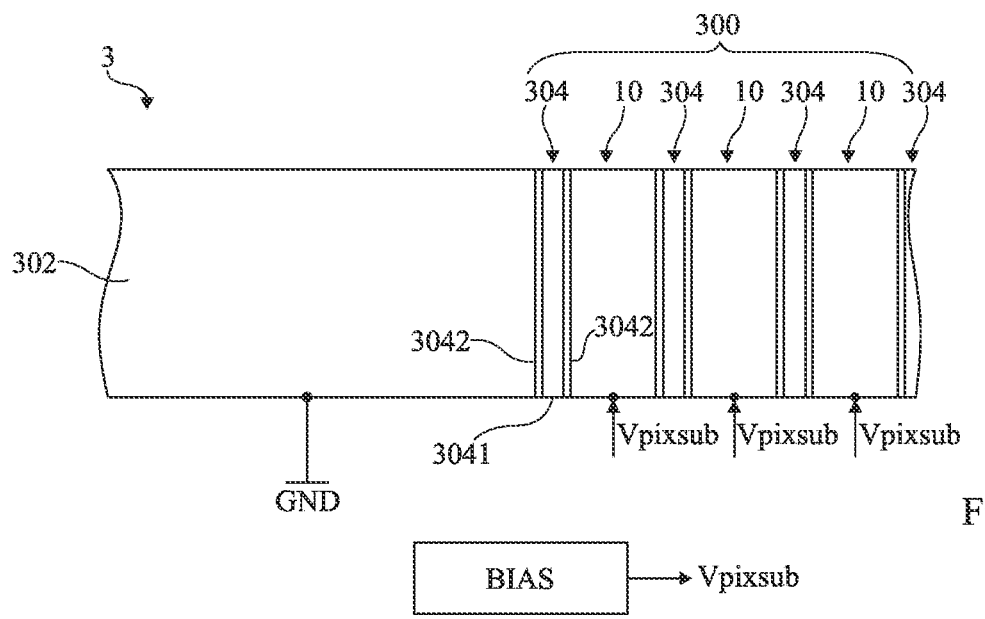
FIG. 3 schematically shows, in a cross-section view, an embodiment of an image sensor of indirect time of flight type.

FIG. 3 schematically shows in a cross-section view an embodiment of an image sensor 3 of indirect time of flight type.

Similarly to the sensor 2 of FIG. 2, sensor 3 comprises an array 300 of pixels 10. Array 300 is implemented inside and on top of a semiconductor substrate 302. In FIG. 2, a portion only of array 300, comprising three pixels 10, is shown. Array 300 is implemented inside and on top of a portion of substrate 302 (on the right-hand side in FIG. 3) which is electrically insulated from the rest of substrate 302 by insulating structures or trenches 304 crossing substrate 300 across its entire thickness.

In the example of FIG. 3, structures 304 are capacitive deep trench insulation structures and correspond to trenches filled with a conductive material 3041 insulated from substrate 302 by an electrically-insulated layer 3042. In other examples, not illustrated, these structures are deep trench insulation, DTI, structures, corresponding to trenches entirely filled with insulator.

In the example of FIG. 3, each pixel 10 is implemented inside and on top of a portion of substrate 302 which is electrically insulated, by structures 304, from portions of substrate 302 having neighboring pixels 10 implemented inside and on top thereof. In other examples, not illustrated, pixels 10 are gathered in groups of neighboring pixels, each group of pixels being implemented inside and on top of a portion of substrate 302 electrically insulated, by structures 304, from portions of substrate 302 having other groups of pixels 10 implemented inside and on top thereof.

Although this is not shown in FIG. 3, each pixel 10 comprises, similarly to the pixel 1 of FIG. 1, a photoconversion area PD and at least two assemblies E1, E2, each comprising a memory area mem1, mem2 and a transfer gate TGmem1, TGmem2 with a buried channel coupling area PD to memory area mem1, mem2. Pixels 10 are for example structurally identical to the pixel 1 of FIG. 1.

It is here provided to apply, for each pixel 10, and at least during each integration phase, a bias voltage Vpixsub different from ground GND, that is, non-zero, to a portion of substrate 302 having pixel 10 arranged inside and on top of it.

According to an embodiment, bias voltage Vpixsub is determined so that, for each pixel 10, each transfer gate coupling area PD of the pixel to a memory area of the pixel is blocked when voltage Vpixsub is applied to the portion of substrate 302 having pixel 10 arranged inside and on top of it and ground GND is applied to this transfer gate, or, in other words, so that the control signal delivered to this transfer gate is at ground potential GND. As a result, as compared with the sensor 2 of FIG. 2, the sensor 3 of FIG. 3 is implemented by suppressing converter 212, inductance L2, and capacitor C2, as will for example be described in further detail in relation with FIG. 6. This simplifies the implementation of sensor 3 as compared with that of sensor 2, and further enables decreasing the bulk of sensor 3 with respect to that of the sensor 2. This also enables decreasing, during each readout phase, the noise in sensor 3 as compared with that in sensor 2.

As an example, voltage Vpixsub is in the range from and excluding 0 V to 1.5 V, for example, from 0.1V to 1.5 V, for example, when voltage Vpixsub is applied to the substrate of a transfer gate, which is then blocked when it receives a control potential equal to ground GND and conductive when it receives a control potential greater than a positive threshold value. According to another example, voltage Vpixsub is in the range from and excluding 0 V to −1.5V, for example, from −0.1V to −1.5 V, for example, when voltage Vpixsub is applied to the substrate of a transfer gate, which is then blocked when it receives a control potential equal to ground GND and conductive when it receives a potential smaller than a negative threshold value.

In the embodiment of FIG. 3, sensor 3 comprises a circuit BIAS configured to deliver, for each pixel 10 and at least during each integration phase, voltage Vpixsub to the portion of substrate 302 having pixel 10 arranged inside and on top of it. Preferably, circuit BIAS comprises one low dropout or LDO voltage regulator, for example, of class AB, configured to deliver voltage Vpixsub. Preferably, circuit BIAS is referenced to ground GND.

Although this is not illustrated in FIG. 3, the voltage Vpixsub delivered by circuit BIAS is applied, for each pixel 10, to the portion of substrate 302 having this pixel implemented inside and on top of it via a circuit for controlling array 300, for example, similar or identical to the circuit 204 described in relation with FIG. 2.

As an example, circuit BIAS is further configured to draw voltage Vpixsub to ground GND when sensor 3 is at standby or unused, that is, outside of integration phases and readout phases. This enables decreasing the power consumption of sensor 3 when it is at standby or unused.

In the example of FIG. 3 where each pixel 10 is electrically insulated from the other pixels of array 300 by a structure 304, voltage Vpixsub is for example applied to each portion of substrate 302 having a pixel 10 implemented inside and on top of it.

In other examples, not illustrated, where the pixels of array 300 are organized in groups and where each group of pixels 10 is electrically insulated from the other pixel groups by a structure 304, voltage Vpixsub is for example applied to each portion of substrate 302 having a group of pixels 10 implemented inside and on top of it.

Preferably, as illustrated in FIG. 3, at least a portion of the rest of substrate 302, that is, at least a portion of the substrate which is electrically insulated from the region of substrate 302 having array 300 implemented inside and on top of it, is biased to ground GND. Indeed, usual circuits implemented based on MOS transistors are generally arranged in the rest of substrate 302 (on the left-hand side in FIG. 3), and the biasing to ground GND enables modifying the operation of these circuits.

Figure 4:
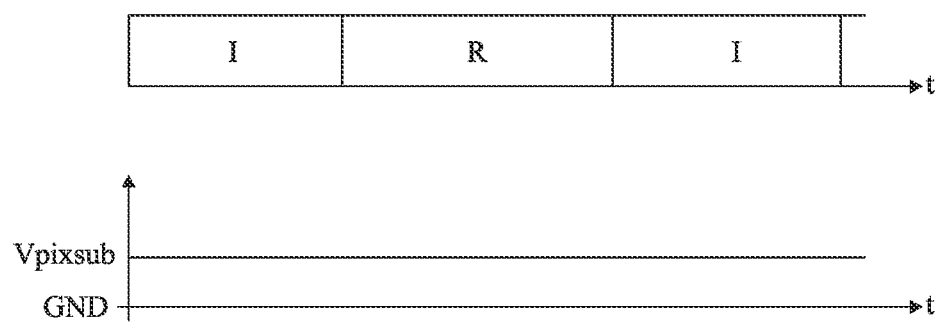
FIG. 4 illustrates the operation of the sensor of FIG. 3 according to an embodiment.

FIG. 4 illustrates the operation of the sensor 3 of FIG. 3 according to an embodiment. More particularly, FIG. 4 illustrates the voltage which is applied, for each pixel 10, to the portion of the substrate comprising this pixel, according to whether the sensor is in an integration phase I or in a readout phase R.

In this embodiment, for each pixel 10, voltage Vpixsub is applied to the substrate portion comprising this pixel all along the duration of operation of the sensor, that is, all along the duration of each integration phase I and all along the duration of each readout phase R.

During each integration phase I, the signals VTGmem1 and VTGmem2 for controlling the gates TGmem1 and TGmem2 of the pixels 10 of sensor 3 are switched between ground GND and a control potential V3. Potential V3 is determined so that by setting a signal VTGmem1 or VTGmem2 to potential V3, the gate TGmem1 or TGmem2 controlled by this signal is conductive. Further, voltage Vpixsub is determined so that by setting a signal VTGmem1 or VTGmem2 to ground GND, the gate TGmem1 or TGmem2 controlled by this signal is blocked. As an example, potential V3 is equal to potential V1 minus potential V2.

During each readout phase, the signals VTGmem1 and VTGmem2 delivered to the gates TGmem1 and TGmem2 of pixels 10 of sensor 3 are maintained at ground GND, whereby the gates are maintained blocked.

In the example of FIG. 4, the useful photogenerated charges are electrons, and voltage Vpixsub is positive.

Figure 5:
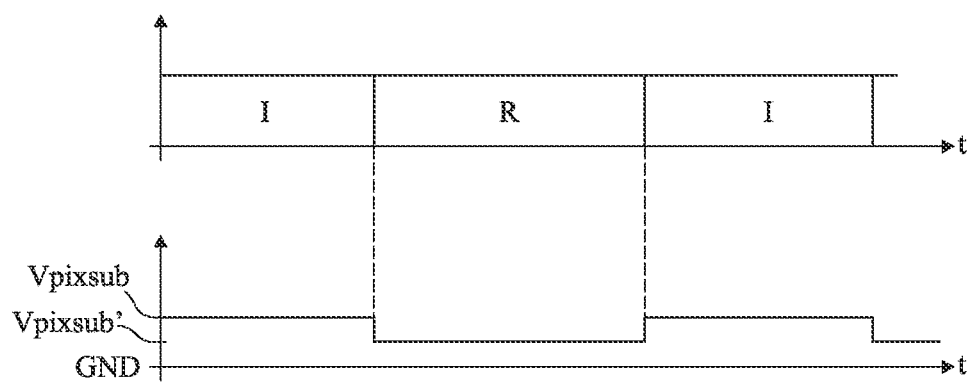
FIG. 5 illustrates the operation of the sensor of FIG. 3 according to another embodiment.

FIG. 5 illustrates the operation of the sensor 3 of FIG. 3 according to another embodiment. More particularly, FIG. 5 illustrates the voltage which is applied, for each pixel 10, to the portion of the substrate comprising this pixel, according to whether the sensor is in an integration phase I or in a readout phase R.

In this embodiment, for each pixel 10, voltage Vpixsub is applied to the substrate portion comprising this pixel during each integration phase I, that is, all along the duration of each integration phase, and a voltage Vpixsub' different from the voltage Vpixsub is applied to this portion of substrate 302 during each pixel readout phase R, that is, all along the duration of each pixel readout phase R.

As an example, voltages Vpixsub and Vpixsub' are delivered by circuit BIAS. Preferably, circuit BIAS comprises at least one low dropout or LDO voltage regulator, for example, of class AB, configured to deliver voltages Vpixsub and Vpixsub'.

For each pixel 10, voltages Vpixsub (integration phase I) and Vpixsub' (readout phase R) are applied to the portion of substrate 302 comprising this pixel 10 via a circuit for controlling array 300, for example similar to the circuit 204 described in relation with FIG. 2.

As an example, circuit BIAS is configured to alternately deliver voltage Vpixsub all along the duration of each integration phase I and voltage Vpixsub' all along the duration of each readout phase R. Circuit BIAS then preferably comprises an LDO regulator, for example, of class AB, alternately delivering voltage Vpixsub and voltage Vpixsub'.

According to another example, circuit BIAS is configured to generate voltages Vpixsub and Vpixsub' all along the duration of operation of sensor 3. Circuit BIAS then preferably comprises an LDO regulator, for example of class AB, delivering voltage Vpixsub and an LDO regulator, for example, of class AB, delivering voltage Vpixsub'. In such an example, either circuit BIAS is configured to supply circuit 204 with voltage Vpixsub during each integration phase and with voltage Vpixsub' during each readout phase, or to simultaneously deliver the two voltages Vpixsub and Vpixsub' to circuit 204, which is then configured to apply voltage Vpixsub to the pixels during each integration phase and voltage Vpixsub' to the pixels during each readout phase.

As an example, circuit BIAS is further configured to draw each of voltages Vpixsub and Vpixsub' to ground GND when the sensor is at standby or is not used, that is, outside of integration phases and readout phases. This enables decreasing the power consumption of the sensor when it is at standby or unused.

During each integration phase I, the signals VTGmem1 and VTGmem2 for controlling the gates TGmem1 and TGmem2 of the pixels 10 of sensor 3 are switched between ground GND and a potential V3. Potential V3 and voltage Vpixsub are determined in the same way as that described in relation with FIG. 4.

Further, voltage Vpixsub' is preferably determined so that, for each pixel 10, during each readout phase R when this voltage Vpixsub' is applied to the region of substrate 302 (FIG. 3) comprising this pixel 10, the transfer gates TGmem1 and TGmem2 of pixel 10 are maintained blocked by maintaining at ground GND the signals VTGmem1 and VTGmem2 delivered to these transfer gates.

In the example of FIG. 5, the useful photogenerated charges are electrons. Voltage Vpixsub is then positive and voltage Vpixsub' is positive or zero.

In the example of FIG. 5, voltage Vpixsub' is smaller than voltage Vpixsub, however, the inverse is also possible.

The provision of two different voltages Vpixsub and Vpixsub' enables optimizing the biasing of the portion of substrate 302 comprising array 300 of pixels 10 (FIG. 3) independently during integration phases I and readout phases R, for example, to decrease the power consumption of sensor 3 and/or to increase the quality of the image obtained due to sensor 3.

Figure 6:
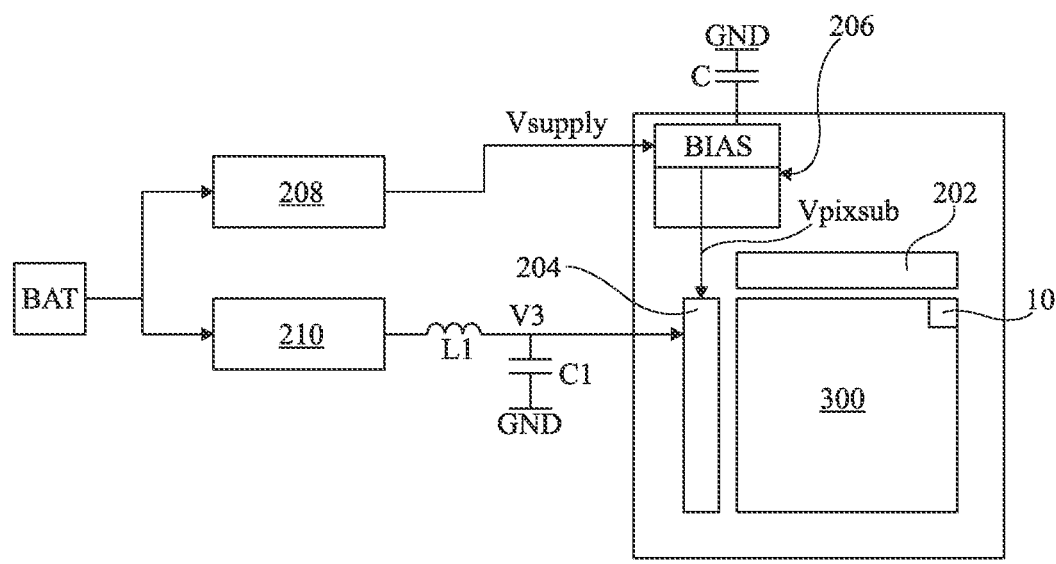
FIG. 6 schematically shows in the form of blocks a more detailed example of an embodiment of the sensor of FIG. 3.

FIG. 6 schematically shows in the form of blocks a more detailed example of an embodiment of sensor 3. In this example, sensor 3 comprises many elements in common with the sensor 2 of FIG. 2, and only the differences between these sensors are here highlighted.

As compared with sensor 2, in sensor 3, the array 200 of pixels 1 is replaced by the array 300 of pixels 10, a single pixel 10 being schematically shown in FIG. 6 to avoid overloading the drawing.

As compared with sensor 2, in sensor 3, voltage converter 210, capacitive element C1, and inductance L1 are configured to deliver control potential V3 instead of potential V1, potential V3 enabling, for each pixel 10, making gate TGmem1, respectively TGmem2, conductive when the signal VTGmem1, respectively VTGmem2, received by this pixel is at potential V3 and voltage Vpixsub is applied to the portion of substrate 302 (FIG. 3) which comprises this pixel.

As compared with the circuit 204 of sensor 2, the circuit 204 of sensor 3 is configured to switch signals VTGmem1 and VTGmem2 between ground GND and the potential level V3 that it receives from converter 210.

According to an embodiment corresponding to what has been described in relation with FIG. 4 and illustrated in FIG. 5, the circuit 204 of sensor 3 is configured to apply, for each pixel 10 and all along the duration of the operation of sensor 3, the voltage Vpixsub that it receives from circuit BIAS to the region of substrate 302 (FIG. 3) which comprises pixel 10. Circuit BIAS is for example configured to deliver voltage Vpixsub from voltage Vsupply. Circuit BIAS for example forms part of the circuit 206 of sensor 3.

According to another embodiment (not illustrated) corresponding to what has been described in relation with FIG. 5, the circuit 204 of sensor 3 is configured to apply, for each pixel 10 and all along the duration of each integration phase I, the voltage Vpixsub that it receives from circuit BIAS to the region of substrate 302 (FIG. 3) which comprises this pixel 10, and to apply, for each pixel 10 and all along the duration of each readout phase R, the voltage Vpixsub' that it receives from circuit BIAS to the region of substrate 302 which comprises this pixel 10. Circuit BIAS is for example configured to deliver voltages Vpixsub and Vpixsub' from voltage Vsupply. As an example, circuit BIAS forms part of the circuit 206 of sensor 3.

According to an embodiment, circuit BIAS comprises a capacitive element C, for example, referenced to ground GND, the capacitive element being for example configured to filter transient phenomena on voltage Vpixsub capable of occurring during each integration phase, due to the switchings of signals VTGmem1 and VTGmem2. As an example, circuit BIAS, and more generally circuit 206, may be implemented inside and on top of the same substrate 302 (FIG. 3) as the array 300 of pixels 10 or, as a variant, inside and on top of another semiconductor substrate, which is then stacked on the substrate of the array 300 of pixels 10. Circuit BIAS and its capacitive element C may be implemented inside and on top of the same semiconductor substrate or, as a variant, capacitive element C may be a discrete component arranged outside of the semiconductor substrate comprising the rest of circuit BIAS.

As compared with sensor 2, sensor 3 does not comprise converter 212, capacitive element C2, and inductance L2, which makes it simpler to implement, more compact, and less expensive. Indeed, circuit BIAS is less complex and less bulky to implement than SMPS-type converter 212.

Figure 7:
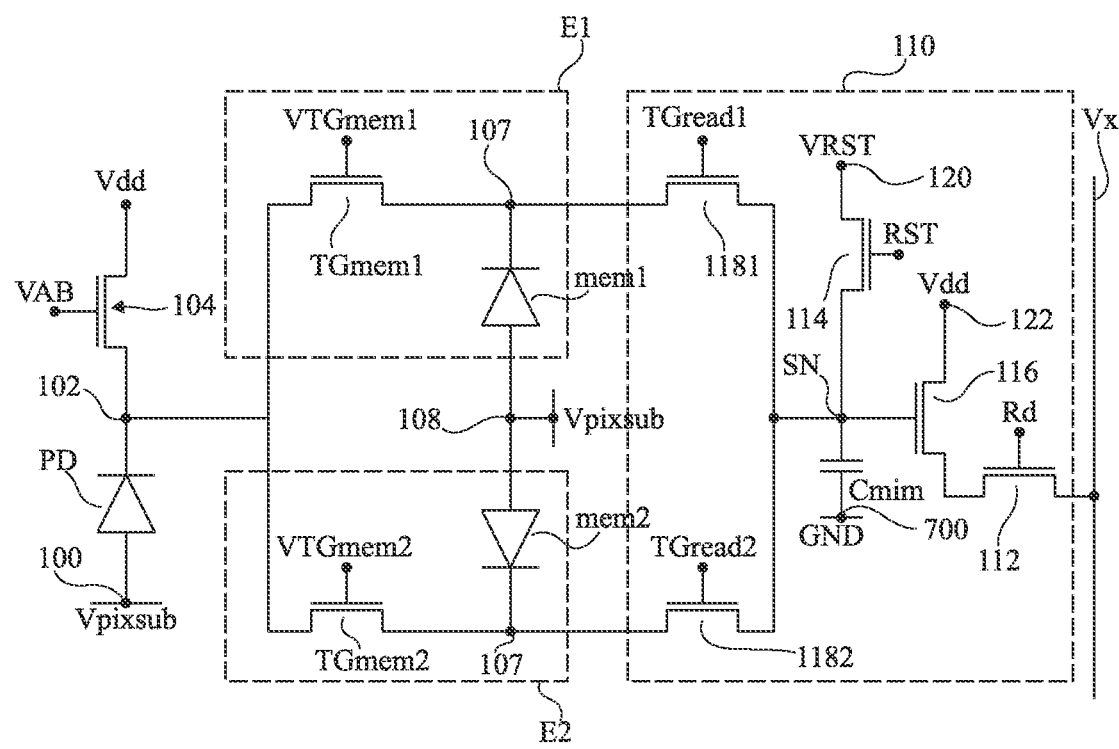
FIG. 7 shows, in the form of a circuit, a more detailed example of a pixel of the sensor of FIG. 3.

FIG. 7 shows, in the form of a circuit, a more detailed example of a pixel 10 of the sensor of FIG. 3 or of FIG. 6.

In this example, pixel 10 is structurally similar, or even identical, to the pixel 1 of FIG. 1 and only the differences between these two pixels are here highlighted.

Pixel 10 differs from pixel 1 essentially in that, instead of applying ground potential GND to the substrate of the pixel, and thus to nodes 100 and 108, voltage Vpixsub is applied to the pixel substrate, at least during each integration phase implemented by this pixel 10.

According to the embodiment illustrated in FIG. 7 and corresponding to what has been described in relation with FIG. 4, voltage Vpixsub is applied to the substrate of pixel 10, and thus to nodes 108 and 102, all along the duration of operation of the sensor, that is, during each integration phase and during each readout phase.

According to another embodiment, not illustrated and corresponding to what has been described in relation with FIG. 5, voltage Vpixsub is applied to the substrate of pixel 10, and thus to nodes 108 and 100, during each integration phase implemented by pixel 10, and voltage Vpixsub' is applied to the substrate of pixel 10, and thus to nodes 108 and 100, during each readout phase implemented by this pixel 10.

Although this is not detailed herein, it will be within the abilities of those skilled in the art to adapt the values of potentials VRST and Vdd as well as the levels of signals TGread1, TGread2, Rd, VAB, and RST according to voltage Vpixsub, and possibly to voltage Vpixsub', so that the pixel 10 of FIG. 7 operates similarly to the pixel 1 of FIG. 1. As an example, all the potential levels delivered to pixel 10 are equal to the corresponding potential levels delivered to pixel 1 from which potential V2 has been subtracted.

According to an embodiment, as illustrated in FIG. 7, a capacitor Cmim, preferably of metal-insulator-metal type, is connected between the detection node SN of output circuit 11o and a node 700 set to ground GND. This enables releasing the constraints relative to the operation of circuit BIAS. It will be within the abilities of those skilled in the art to adapt this embodiment to the case of an output circuit 110 comprising more than one detection node SN, for example, by providing that, for each node SN, a capacitor Cmim is connected between this node SN and node 700. It will also be within the abilities of those skilled in the art to adapt this embodiment to the case where node 700 is not at ground GND but at another potential level, for example, potential Vpixsub, even in the case where the value of the potential on node 700 may be different according to whether the pixel is being read or not.

Although a pixel 10 comprising two assemblies E1 and E2 has been described, it will be within the abilities of those skilled in the art to adapt the described embodiments and variants to a pixel 10 comprising more than two identical assemblies of a memory area and of a transfer gate coupling area PD to the memory area of the considered assembly.

Further, although embodiments and variants where each memory area is a pinned diode or pinned memory have been described, it will be within the abilities of those skilled in the art to adapt these embodiments and variants to the case where each memory area is a capacitive element, for example, by modifying circuit 110. In other words, it will be within the abilities of those skilled in the art to adapt the embodiments and variants described in the case of a charge domain pixel 10 to the case of a voltage domain pixel 10.

Further, it will be within the abilities of those skilled in the art to adapt the described embodiments in the case where the useful photogenerated charges are holes and not electrons. In particular, in this case, potential V3 and voltage Vpixsub are negative, voltage Vpixsub', when it is provided, being negative or zero.

Further, the described embodiments and variants are not limited to the example of circuit 110 described in relation with FIG. 7. It will be within the abilities of those skilled in the art to provide other output circuits of pixel 10, for example, a circuit 110 comprising a first detection node SN associated with memory area mem1 and coupled to a first line Vx by a first assembly of a transistor 116 assembled as a follower source and of a selection transistor 112, and a second detection node SN associated with memory area mem2 and coupled to a second line Vx by a second assembly of a transistor 116 assembled as a follower source and of a selection transistor 112.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

What is claimed is:

1. An image sensor comprising:
an array of pixels arranged inside and on top of a region of a semiconductor substrate electrically insulated from a remainder of the substrate by insulating trenches crossing the substrate, wherein each pixel comprises a photoconversion area and at least two assemblies, wherein each assembly comprises a memory area and a transfer gate coupling the memory area to the photoconversion area; and
a first circuit configured to apply, for each pixel and at least during each integration phase, a first bias voltage different from a ground potential to a portion of the substrate having the pixel arranged inside and on top of it, wherein the first bias voltage is a positive voltage.

2. The image sensor of claim 1, wherein, for each assembly of each pixel, the transfer gate of the assembly is blocked when the first bias voltage is applied to the portion of the substrate having the pixel arranged inside and on top of it and the ground potential is applied to the transfer gate.

3. The image sensor of claim 1, wherein at least a portion of the remainder of the substrate is configured to be biased to the ground potential.

4. The image sensor of claim 1, wherein each pixel comprises at least one detection node connected to a first electrode of a capacitive element, and a second electrode of the capacitive element is connected to the ground potential.

5. The image sensor of claim 4, wherein the capacitive element is a metal-insulator-metal capacitive element.

6. The image sensor of claim 1, wherein the first circuit is configured to control, for each transfer gate of each assembly of each pixel, a setting to a conductive state of the transfer gate by applying a control potential to the transfer gate, and a setting to a blocked state of the transfer gate by applying the ground potential to the transfer gate.

7. The image sensor of claim 6, comprising a switched-mode power supply configured to deliver the control potential.

8. The image sensor of claim 7, wherein the switched-mode power supply is implemented outside of the substrate.

9. The image sensor of claim 1, wherein the first circuit is configured, for each pixel, to apply the first bias voltage to the portion of the substrate having the pixel arranged inside and on top of it all along a duration of operation of the sensor.

10. The image sensor of claim 1, comprising a second circuit configured to receive a power supply voltage and to generate the first bias voltage from the power supply voltage.

11. The image sensor of claim 10, wherein the second circuit comprises a class AB low dropout regulator configured to deliver the first bias voltage.

12. The image sensor of claim 1, wherein the first circuit is configured, for each pixel, to apply a second bias voltage to the portion of the substrate having the pixel arranged inside and on top of it during each readout phase of the pixel.

13. The image sensor of claim 12, wherein, for each assembly of each pixel, each transfer gate of the assembly is blocked when the second bias voltage is applied to the portion of the substrate having the pixel arranged inside and on top of it and the ground potential is applied to the transfer gate.

14. The image sensor of claim 12, comprising a second circuit configured to receive a power supply voltage and to generate, from the power supply voltage, the first bias voltage and the second bias voltage.

15. The image sensor of claim 14, wherein the second circuit comprises at least one class AB low dropout, LDO, regulator, configured to deliver the first bias voltage and the second bias voltage.

16. The image sensor of claim 1, wherein each transfer gate of each assembly of each pixel has a buried channel.

17. The image sensor of claim 1, wherein the sensor is of indirect time of flight type.

18. An image sensor comprising:
an array of pixels arranged inside and on top of a region of a first substrate electrically insulated from a remainder of the first substrate by insulating trenches crossing the first substrate, wherein each pixel comprises a photoconversion area and at least two assemblies, wherein each assembly comprises a memory area and a transfer gate coupling the memory area to the photoconversion area;

a readout circuit, configured to selectively receive, during each readout phase, output signals from each row of the array of pixels;

a second circuit, configured to generate, from a power supply voltage, a first bias voltage different from a ground potential, the second circuit being inside and on top of a second substrate, the second substrate being stacked on the first substrate; and a first circuit, configured to apply, for each pixel and during each integration phase, the first bias voltage to a portion of the first substrate having the pixel arranged inside and on top of it.

19. The image sensor of claim 18, further comprising:

a switched-mode power supply configured deliver a control potential to the first circuit, wherein the first circuit is configured to use the control potential and the ground potential to control a state of each transfer gate; and a voltage regulator configured to provide the power supply voltage to the second circuit.

20. The image sensor of claim 18, wherein, for each assembly of each pixel, the transfer gate of the assembly is blocked when the first bias voltage is applied to the portion of the first substrate having the pixel arranged inside and on top of it and the ground potential is applied to the transfer gate.

21. An image sensor comprising:

an array of pixels arranged inside and on top of a region of a semiconductor substrate electrically insulated from a remainder of the substrate by insulating trenches crossing the substrate, wherein each pixel comprises a photoconversion area and at least two assemblies, wherein each assembly comprises a memory area and a transfer gate coupling the memory area to the photoconversion area;

a first circuit configured to apply, for each pixel and at least during each integration phase, a first bias voltage different from a ground potential to a portion of the substrate having the pixel arranged inside and on top of it, the first bias voltage being in a range of 0.1 V to 1.5 V; and a second circuit, configured to generate, from a power supply voltage, the first bias voltage.

* * * * *